United States Patent
Siau

(10) Patent No.: US 8,339,867 B2
(45) Date of Patent: Dec. 25, 2012

(54) FUSE ELEMENTS BASED ON TWO-TERMINAL RE-WRITEABLE NON-VOLATILE MEMORY

(75) Inventor: Chang Hua Siau, San Jose, CA (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 10 days.

(21) Appl. No.: 12/653,850

(22) Filed: Dec. 18, 2009

(65) Prior Publication Data
US 2010/0195409 A1 Aug. 5, 2010

Related U.S. Application Data

(60) Provisional application No. 61/206,446, filed on Jan. 30, 2009.

(51) Int. Cl.
*G11C 7/10* (2006.01)
(52) U.S. Cl. .................................. 365/189.05
(58) Field of Classification Search ............. 365/189.05, 365/148
See application file for complete search history.

(56) References Cited

U.S. PATENT DOCUMENTS

| | | | |
|---|---|---|---|
| 6,362,675 B1 * | 3/2002 | Alwais | 327/218 |
| 6,717,780 B2 * | 4/2004 | Hiramoto et al. | 360/324.2 |
| 7,239,173 B1 * | 7/2007 | Voogel | 326/38 |
| 2006/0171200 A1 * | 8/2006 | Rinerson et al. | 365/185.1 |
| 2007/0103963 A1 * | 5/2007 | Kim et al. | 365/148 |
| 2008/0225590 A1 * | 9/2008 | Lamorey | 365/185.05 |
| 2008/0304308 A1 * | 12/2008 | Stipe | 365/51 |
| 2009/0161408 A1 * | 6/2009 | Tanigami et al. | 365/148 |

\* cited by examiner

*Primary Examiner* — Hoai V Ho
*Assistant Examiner* — Min Huang
(74) *Attorney, Agent, or Firm* — Stolowitz Ford Cowger LLP

(57) ABSTRACT

A margin restore fuse element is described, including a latch configured to store data, a first memory element coupled to the latch and configured to store a first resistive value, a second memory element coupled to the latch and configured to store a second resistive value, a restore circuit coupled to the latch, the first memory element, and the second memory element, the restore circuit being configured to perform a restore data operation to substantially restore the first and second memory elements to the first and second resistive values, respectively. The latch, restore circuit, and other circuitry can be formed FEOL on a substrate (e.g., a semiconductor wafer) as part of a microelectronics fabrication process and the fuse element and memory elements can be formed BEOL over the substrate as part of another microelectronics fabrication process. The fuse and memory elements can be included in a two-terminal non-volatile memory cell.

11 Claims, 12 Drawing Sheets

FUSE ELEMENTS BASED ON TWO-TERMINAL RE-WRITEABLE NON-VOLATILE MEMORY

FIELD OF THE INVENTION

The present invention relates generally to semiconductors and memory technology. More specifically, a fuse element based on non-volatile memory is described.

BACKGROUND

In conventional integrated circuits, memory cells often have manufacturing defects that reduce the yield of semiconductor devices. Further, memory cells can become less effective during the lifetime of a semiconductor device. In some conventional solutions, a fuse element is used to provide redundant or more effective memory cells to replace defective or ineffective memory cells.

In conventional techniques, fuse elements are designed with non-volatile memory, rather than volatile memory. A volatile memory is a memory that loses its contents when power is removed from the memory. A non-volatile memory is a memory that retains its contents when power is removed from (i.e., not applied to) the memory. Conventionally, memory (i.e., material used for data storage) is formed and fabricated using various types of material, such as semiconductors, silicon dioxide, conductive or complex metal oxides (CMO), and others.

Some memory elements can be designed to store data as resistive values. However, conventional solutions are often affected by problems such as disturb effects. For example, a read disturb occurs when the resistive value of a memory element is corrupted by multiple accesses to the memory element. The resistive value of a memory element changes (i.e., increases or decreases) in small increments for each read access to the memory element, resulting in a corrupted resistive value over multiple read accesses to the memory element. Since non-volatile memory elements are read at a higher frequency than volatile memory elements, a fuse element designed with non-volatile memory such as CMO is more susceptible to read disturbs.

FIG. 1 illustrates a conventional fuse element. Here, conventional fuse element 100 includes latch 110, gates 120-122, memory elements 130-132, and enable signal 140. Latch 110 typically functions as a temporary data storage system, storing data in response to an active signal on enable signal 140. Memory elements 130-132 are designed to store data as resistive values. For example, memory element 130 has a resistive value indicative of a programmed state and memory element 132 can have a resistive value indicative of an erased state. Gates 120-122 control the flow of data communicated between latch 110 and memory elements 130-132. In conventional fuse elements (e.g., fuse element 100), gates 120-122 are typically implemented as transistors. However, resistive values of memory elements 130-132 may be corrupted by disturb effects.

There are continuing efforts to improve fuse element technology for use with non-volatile memory.

BRIEF DESCRIPTION OF THE DRAWINGS

The invention and its various embodiments are more fully appreciated in connection with the following detailed description taken in conjunction with the accompanying drawings, in which.

Figure 1:
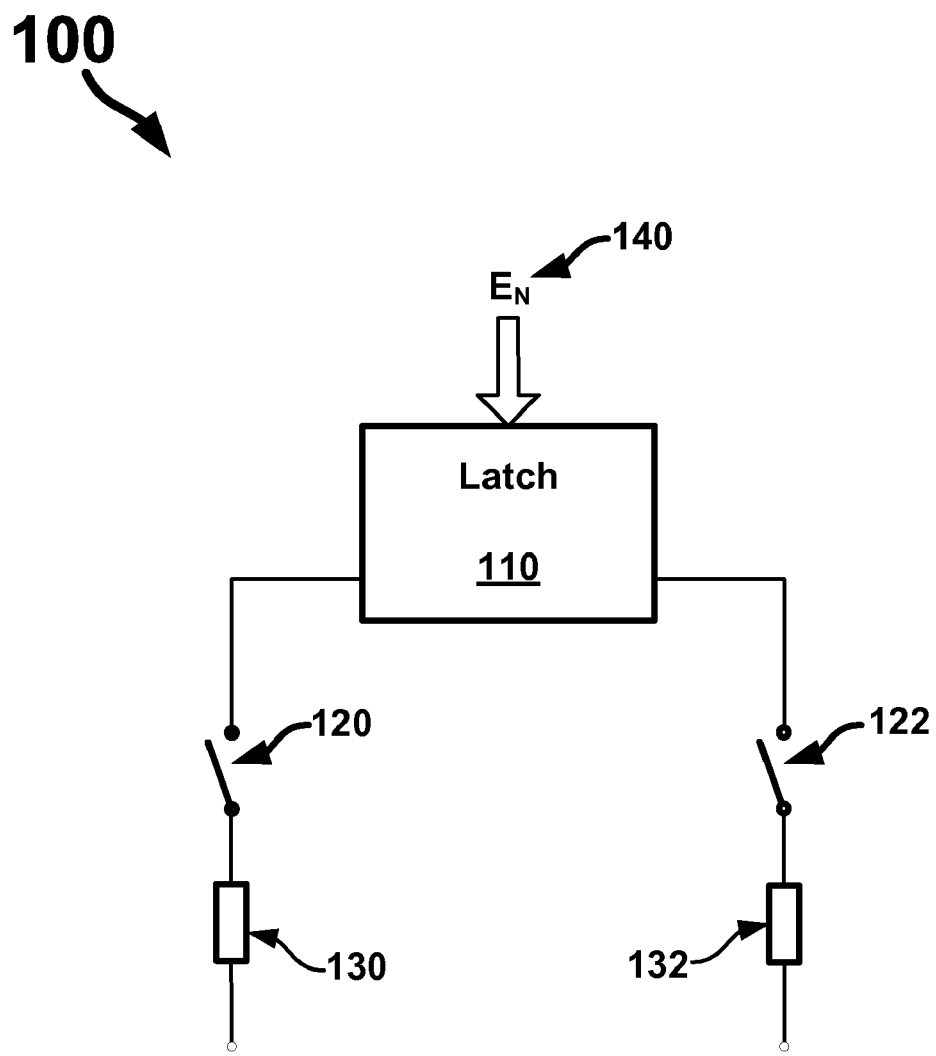
FIG. 1 depicts a conventional fuse element.

Although the previous drawings depict various examples of the invention, the invention is not limited by the depicted examples. It is to be understood that, in the drawings, like reference numerals designate like structural elements. Also, it is understood that the depictions in the FIGS. are not necessarily to scale.

DETAILED DESCRIPTION

Various examples may be implemented in numerous ways, including as a system, a process, an apparatus, or a series of program instructions on a computer readable medium such as a computer readable storage medium or a computer network where the program instructions are sent over optical, electronic, or other wired or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the embodiments has not been described in detail to avoid unnecessarily obscuring the description.

Figure 5A:
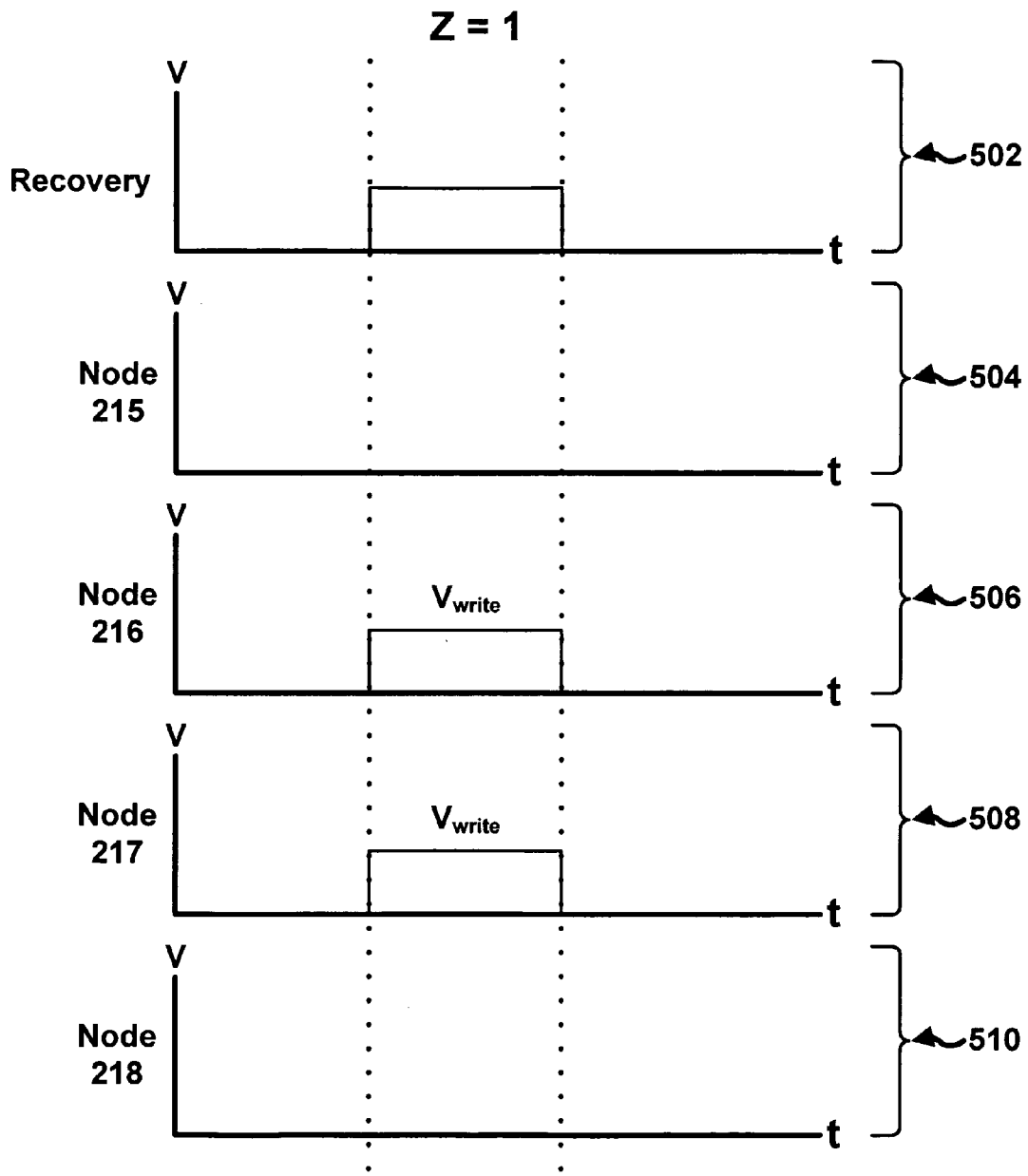
FIG. 5A depicts an exemplary recovery operation, according to the present invention.

Fuse elements based on non-volatile memory may be designed with memory elements such as those disclosed in U.S. patent application Ser. No. 11/095,026, filed Mar. 30, 2005, now published as U.S. Published Application No. 20060171200, and entitled "Memory Using Mixed Valence Conductive Oxides," and hereby incorporated by reference in its entirety for all purposes and describing non-volatile third dimensional memory elements that may be arranged in a two-terminal, cross-point memory array. New memory structures are possible with the capability of this third dimensional memory array. In at least some embodiments, a two-terminal memory element or memory cell can be configured to change conductivity when exposed to an appropriate voltage drop across the two-terminals. The memory element can include an electrolytic tunnel barrier and a mixed valence conductive oxide or other type of conductive oxides. A voltage drop across the electrolytic tunnel barrier can cause an electrical field within the mixed valence conductive oxide that is strong enough to move oxygen ions out of the mixed valence conductive oxide and into the electrolytic tunnel barrier. When certain mixed valence conductive oxides (e.g., praseodymium-calcium-manganese-oxygen perovskites—PCMO and lanthanum-nickel-oxygen perovskites—LNO) change valence, their conductivity changes. Additionally, oxygen accumulation in certain electrolytic tunnel barriers (e.g., yttrium stabilized zirconia—YSZ) can also change conductivity. If a portion of the mixed valence conductive oxide near the electrolytic tunnel barrier becomes less conductive, the tunnel barrier width effectively increases. If the electrolytic tunnel barrier becomes less conductive, the tunnel barrier height effectively increases. Both mechanisms can be reversible if the excess oxygen from the electrolytic tunnel barrier flows back into the mixed valence conductive oxide. A memory can be designed to exploit tunnel barrier height modification, tunnel barrier width modification, or both. The technology allows for the emulation of other memory technologies by duplicating the interface signals and protocols, while accessing the third dimensional memory array. The third dimensional memory array may emulate other types of memory, providing memory combinations within a single component. To illustrate the functionality of a third dimensional memory element, consider that the third dimensional memory element switches to a low resistive state in response to a first write voltage, and switches to a high resistive state when a second write voltage is applied. In some examples, the first write voltage may be opposite in polarity from the second write voltage. The resistance of the memory element may be adjusted by the voltage differential across the memory element. As such, the two terminals of the memory element may be coupled to one or more variable voltage sources to create a voltage differential across the two terminals. For example, a first terminal of the memory element may be programmed to be a certain voltage between, for instance, +3 Volts and −3 Volts. Further, a second terminal of the memory element may be programmed to be another voltage between, for instance, +3 Volts and −3 Volts. FIG. 5C is a block diagram representing the basic components of one embodiment of a memory element 560, FIG. 5D is a block diagram of the memory element 560 in a two-terminal memory cell, and FIG. 5E is a block diagram of the memory element embodiment of FIG. 5C in a three-terminal memory cell. FIG. 5C shows an electrolytic tunnel barrier 565 and an ion reservoir 570, two basic components of the memory element 560. FIG. 5D shows the memory element 560 between a top memory electrode 575 and a bottom memory electrode 580. The orientation of the memory element (i.e., whether the electrolytic tunnel barrier 565 is near the top memory electrode 575 or the bottom memory electrode 580) may be important for processing considerations, including the necessity of seed layers and how the tunnel barrier reacts with the ion reservoir 570 during deposition. FIG. 5E shows the memory element 560 oriented with the electrolytic tunnel barrier 565 on the bottom in a three-terminal transistor device, having a source memory element electrode 585, gate memory element electrode 587 and a drain memory element electrode 589. In such an orientation, the electrolytic tunnel barrier 565 could also function as a gate oxide. Referring back to FIG. 5C, the electrolytic tunnel barrier 565 will typically be between 10 and less than 50 angstroms. If the electrolytic tunnel barrier 565 is much greater than 50 angstroms, then the voltage that is required to create the electric field necessary to move electrons through the memory element 560 via tunneling becomes too high for most electronic devices. Depending on the electrolytic tunnel barrier 565 material, a preferred electrolytic tunnel barrier 565 width might be between 15 and 40 angstroms for circuits where rapid access times (on the order of tens of nanoseconds, typically below 100 ns) in small dimension devices (on the order of hundreds of nanometers) are desired. Fundamentally, the electrolytic tunnel barrier 565 is an electronic insulator and an ionic electrolyte. As used herein, an electrolyte is any medium that provides an ion transport mechanism between positive and negative electrodes. Materials suitable for some embodiments include various metal oxides such as $Al_2O_3$, $Ta_2O_5$, $HfO_2$ and $ZrO_2$. Some oxides, such as zirconia might be partially or fully stabilized with other oxides, such as CaO, Mgo, or $Y_2O_3$, or doped with materials such as scandium. The electrol tunnel barrier 565 will typically be of very high quality, being as uniform as possible to allow for predictability in the voltage required to obtain a current through the memory element 560. Although atomic layer deposition and plasma oxidation are examples of methods that can be used to create very high quality tunnel barriers, the parameters of a particular system will dictate its fabrication options. Although tunnel barriers can be obtained by allowing a reactive metal to simply come in contact with an ion reservoir 570, as described in PCT Patent Application No. PCT/US04/13836, filed May 3, 2004, already incorporated herein by reference, such barriers may be lacking in uniformity, which may be important in some embodiments. Accordingly, in a preferred embodiment of the invention the tunnel barrier does not significantly react with the ion reservoir 570 during fabrication. With standard designs, the electric field at the tunnel barrier 565 is typically high enough to promote tunneling at thicknesses between 10 and 50 angstroms. The electric field is typically higher than at other points in the memory element 560 because of the relatively high serial electronic resistance of the electrolytic tunnel barrier 565. The high electric field of the electrolytic tunnel barrier 565 also penetrates into the ion reservoir 570 at least one Debye length. The Debye length can be defined as the distance which a local electric field affects distribution of free charge carriers. At an appropriate polarity, the electric field within the ion reservoir 570 causes ions (which can be positively or negatively charged) to move from the ion reservoir 570 through the electrolytic tunnel barrier 565, which is an ionic electrolyte. The ion reservoir 570 is a material that is conductive enough to allow current to flow and has mobile ions. The ion reservoir 570 can be, for example, an oxygen reservoir with mobile oxygen ions. Oxygen ions are negative in charge, and will flow in the direction opposite of current. Each memory plug contains layers of materials that may be desirable for fabrication or functionality. For example, a non-ohmic characteristic that exhibit a very high resistance regime for a certain range of voltages ($V_{NO-}$ to $V_{NO+}$) and a very low resistance regime for voltages above and below that range might be desirable. In a cross point array, a non-ohmic characteristic could prevent leakage during reads and writes if half of both voltages were within the range of voltages $V_{NO-}$ to $V_{NO+}$. If each conductive array line carried ½ $V_W$, the current path would be the memory plug at the intersection of the two conductive array lines that each carried ½ $V_W$. The other memory plugs would exhibit such high resistances from the non-ohmic characteristic that current would not flow through the half-selected plugs.

In some embodiments, an electrolytic tunnel barrier and one or more mixed valence conductive oxide structures do not need to operate in a silicon substrate, and, therefore, can be fabricated (e.g., back-end-of-the-line BEOL) above circuitry being used for other purposes (e.g., fabricated front-end-of-the-line FEOL). Further, a two-terminal memory cell can be arranged as a cross point such that one terminal is electrically coupled with an X-direction line (or an "X-line") and the other terminal is electrically coupled with a Y-direction line (or a "Y-line"). A third dimensional memory can include multiple memory cells vertically stacked upon one another, sometimes sharing X-direction and Y-direction lines in a layer of memory, and sometimes having isolated lines. When a first write voltage, VW1, is applied across the memory cell (e.g., by applying ½ VW1 to the X-direction line and ½-VW1 to the Y-direction line), the memory cell can switch to a low resistive state. When a second write voltage, VW2, is applied across the memory cell (e.g., by applying ½ VW2 to the X-direction line and ½-VW2 to the Y-direction line), the memory cell can switch to a high resistive state. Memory cells using electrolytic tunnel barriers and mixed valence conductive oxides can have VW1 opposite in polarity from VW2.

Accordingly, the fuse elements based on non-volatile memory can be fabricated BEOL over circuitry previously fabricated FEOL on a substrate (e.g., a silicon—Si wafer). An inter-level interconnect structure can be used to electrically couple the BEOL fuse elements with the FEOL circuitry in the substrate below. Furthermore, the fuse elements can be fabricated along with a two-terminal cross-point memory array that is fabricated BEOL above the aforementioned FEOL circuitry positioned on the substrate below. The fuse elements can be incorporated into the array itself or can be fabricated along with the array as separate fuse element structures. The FEOL circuitry fabricated on the substrate below (e.g., CMOS circuitry) can include circuitry for performing data operations (e.g., read, write, program, and erase) on two-terminal memory cells positioned in the two-terminal cross-point memory array and operative to store data as a plurality of conductivity profiles. The same or different FEOL circuitry can be used to access the fuse elements.

Figure 2:
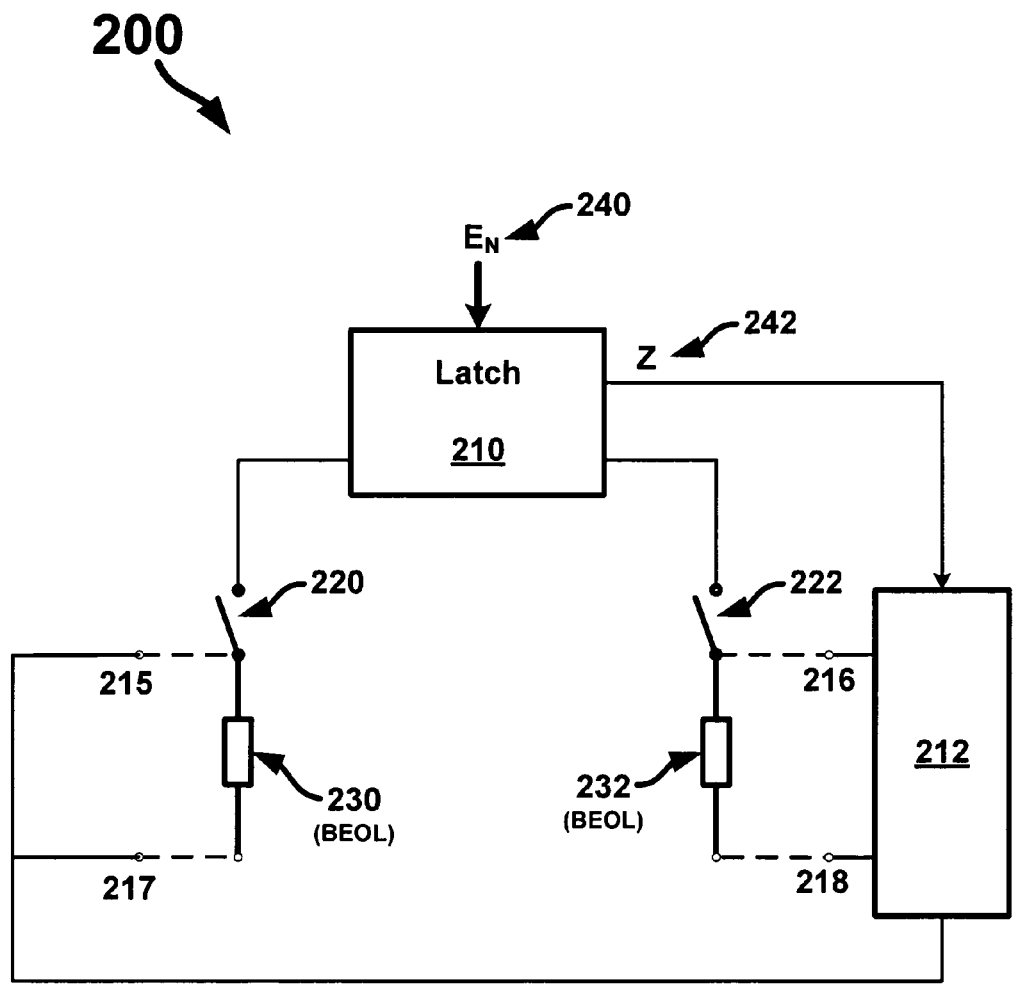
FIG. 2 depicts an exemplary margin restore fuse element, according to the present invention.

FIG. 2 illustrates an exemplary margin restore fuse element. Here, fuse element 200 includes latch 210, gates 220-222, nodes 215-218, restore circuit 212, memory elements 230-232, enable signal 240, and restore data 242 ("Z"). As described above, the memory elements 230-232 can be fabricated BEOL over previously fabricated FEOL circuitry for latch 210, gates 220-222, restore circuit 212, and circuitry used for other purposes or required for data operations to the memory elements 230-232. Although only two memory elements are depicted, other embodiments can include more memory elements than depicted in FIG. 2. An inter-level interconnect structure can be used to electrically couple the FEOL circuitry with the BEOL memory elements. Latch 210 functions as an amplifier and temporary data storage system, storing data in response to an active signal on enable signal 240. In some examples, latch 210 generates restore data 242 and sends restore data 242 to restore circuit 212. In some examples, restore data 242 is generated by latch 210 based on data stored in latch 210. Based on the value of restore data 242, restore circuit 212 drives voltages to nodes 215-218 to restore the respective memory states in memory elements 230-232. In some examples, memory elements 230-232 may be non-volatile memory elements. In other examples, memory elements 230-232 can be conductive metal oxide (CMO) memory elements. In some examples, restore data 242 may be equal to one if memory element 230 is in an erased state and memory element 232 is in a programmed state. In other examples, restore data 242 may be equal to zero if memory element 230 is in a programmed state and memory element 232 is in an erased state. Restore circuit 212 processes restore data 242 and applies appropriate voltages to nodes 215-218. The appropriate voltages are described below in conjunction with FIGS. 5A and 5B.

In some examples, fuse element 200 may have additional memory elements (not shown) electrically coupled with memory elements 230-232. For example, one or more memory elements configured electrically in parallel and/or in series with one another can be used to form a multiple element or "multi-element" unit. In other examples, a multi-element unit may be used to replace memory element 230, memory element 232, or both. When a multi-element unit is used, a multiplexer (not shown) may be used to control access to latch 210. In other examples, fuse element 200 and the above-described elements may be varied and are not limited to the functions, structures, configurations, or implementations provided. For example, the multi-element unit can include memory elements electrically coupled in parallel, in series, or in a variety of series/parallel combinations.

Figure 3:
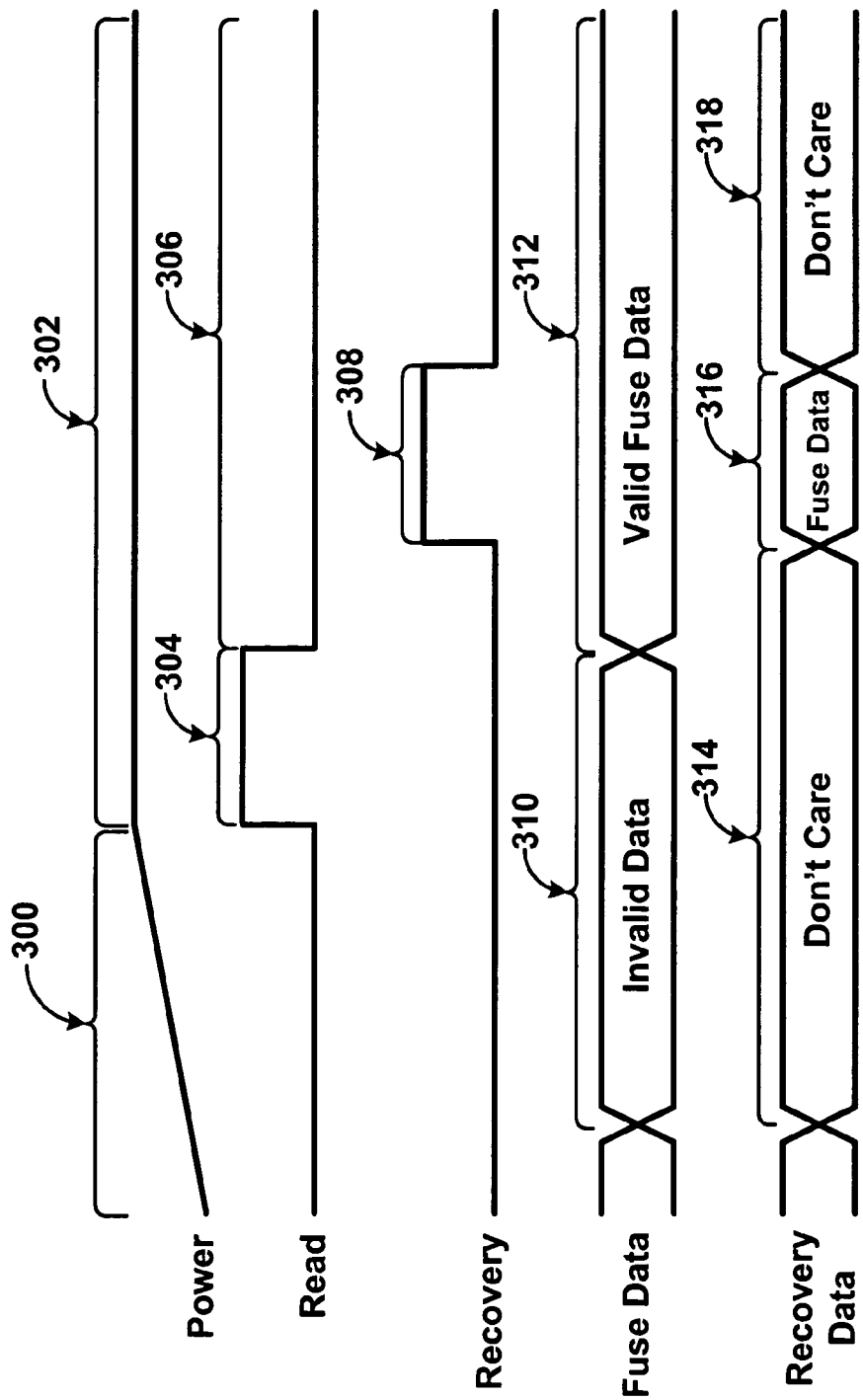
FIG. 3 depicts a timing diagram for an exemplary margin restore fuse element, according to the present invention.

FIG. 3 illustrates a timing diagram for an exemplary margin restore fuse element. In some examples, during a margin restore fuse element power-up (i.e., signal 300), read operation 304 may be performed, followed by delay 306, followed by recovery operation 308 when needed. Although delay 306 shown in FIG. 3 is relatively small, in other examples, delay 306 may be disposed between read operation 304 and recovery operation 308 may be shorter or longer than shown. Prior to read operation 304, a fuse element (not shown) may contain little or no usable data. After read operation 304 is completed, valid fuse data 312 may be stored in a fuse element. Read operation 304 is described in further detail in connection with FIG. 4 below.

Referring back to FIG. 3, during recovery operation 308, recovery data based on fuse data 316 may be used to generate restore data (not shown). In some examples, restore data may be used to determine appropriate voltages to apply to a memory element, such as those described above in connection with U.S. patent application Ser. No. 11/095,026, in order to restore the memory element to its original state. Restore operations are described in further detail in connection with FIGS. 5A and 5B below.

Figure 4:
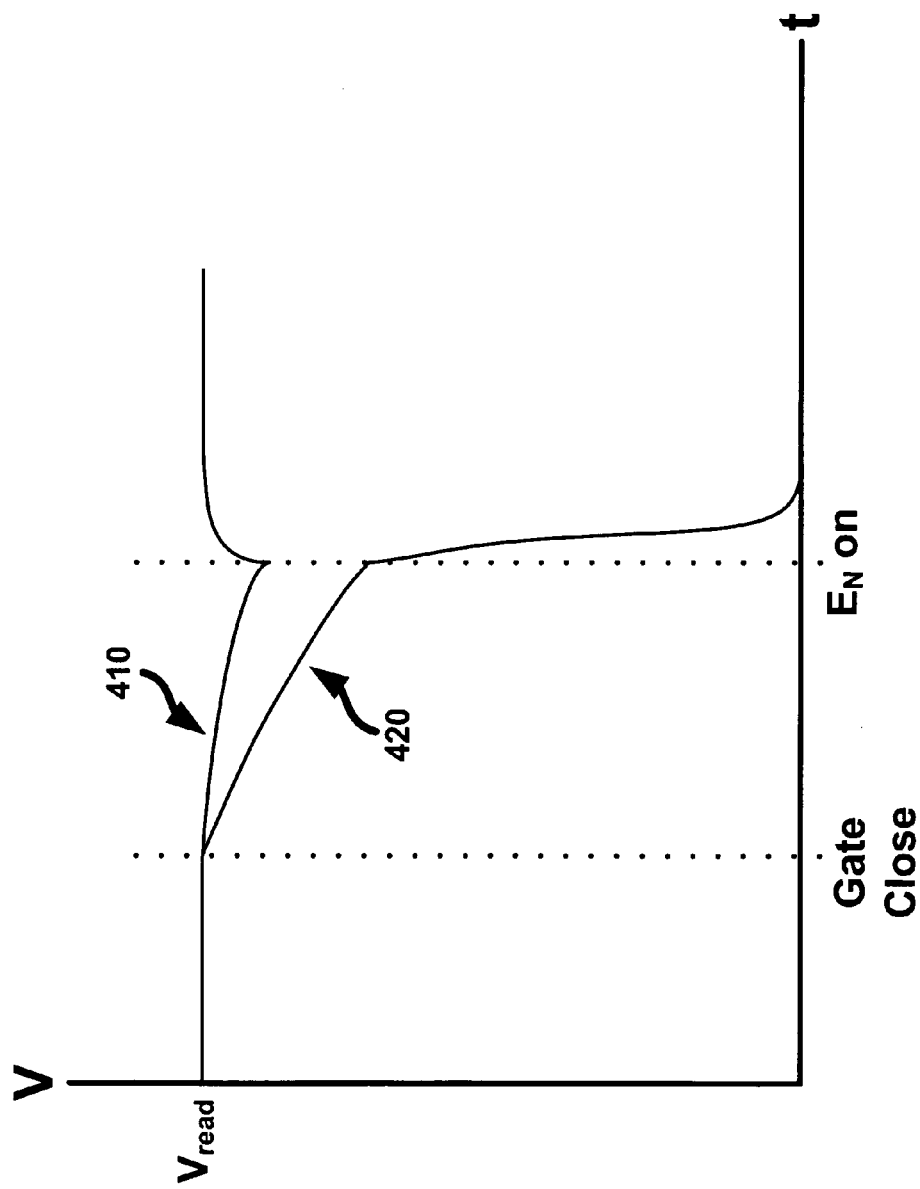
FIG. 4 depicts an exemplary time-voltage graph of a read operation, according to the present invention.

FIG. 4 illustrates an exemplary time-voltage graph of a read operation. In some examples, a read operation may be performed using the elements described in connection with fuse element 200 (FIG. 2). After gates 220-222 close, latch 210 reads the voltage values from memory elements 230-232. As an example, voltage 410 illustrates the voltage of a memory element in a programmed state and voltage 420 illustrates the voltage of a memory element in an erased state. Voltage 410 exhibits a slight decrease over time while voltage 420 exhibits a greater decrease over time. When latch 210 is enabled (i.e., enable signal 240 is in the "on" position), voltage 420 is suppressed down to zero or substantially zero volts and voltage 410 is pulled up to substantially the initial Vread volts.

In some examples, latch 210 may be designed to output restore data 242, which indicates the amplified voltage values shown in FIG. 4. In some examples, latch 210 may be configured to produce restore data 242 with a data value ("value") of one (i.e., "1" or logic high) if memory element 230 is in an erased state and memory element 232 is in a programmed state. As referenced below, FIG. 5A illustrates a recovery operation when the value of restore data 242 is one. In other examples, latch 210 may be configured to produce a restore data 242 value of zero (i.e. "0" or logic low) if memory element 232 is in an erased state and memory element 230 is in a programmed state. As described below, FIG. 5B illustrates a recovery operation when the value of restore data 242 is zero.

FIG. 5A illustrates an exemplary recovery operation. Here, the value of Z (i.e., restore data 242 (FIG. 2)) equals one and voltage signal patterns 502-510 applied to various nodes (i.e., nodes 215-218 (FIG. 2)) associated with a recovery operation are shown. In some examples, Z may be equal to one when memory element 230 (FIG. 2) is in an erased state and memory element 232 (FIG. 2) is in a programmed state. To restore memory element 230 back to approximately its original erased state, restore circuit 212 (FIG. 2) applies a voltage of Vwrite volts, which may be much higher than Vread volts, to node 217 (FIG. 2) and holds node 215 (FIG. 2) at close to zero volts. To restore memory element 232 back to approximately its original programmed state, restore circuit 212 applies a voltage of Vwrite volts to node 216 (FIG. 2) and holds node 218 (FIG. 2) at close to zero volts. During a recovery operation when Z is equal to one, nodes 215-218 are at voltage levels of zero, Vwrite, Vwrite, and zero, respectively. By applying the appropriate voltages, memory elements 230-232 may be restored to their original resistive values, correcting corruption caused by read disturbs. Circuitry (e.g., voltage sources and drivers) for generating the above mentioned voltages (e.g., Vread, Vwrite) can be fabricated FEOL on a substrate along with the latch, gates, and restore circuit.

Figure 5B:
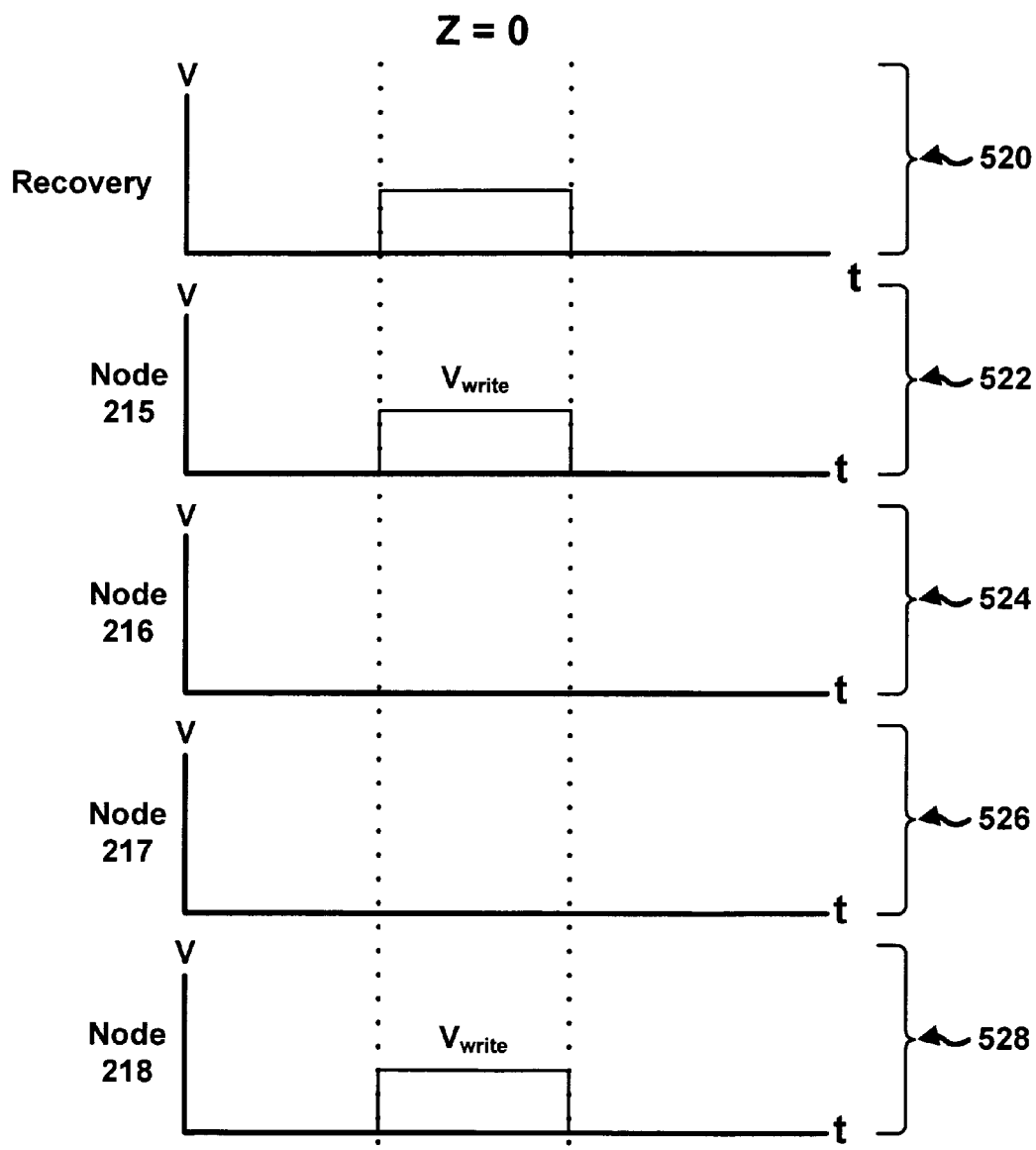
FIG. 5B depicts an alternative exemplary recovery operation, according to the present invention.
Figure 5C:
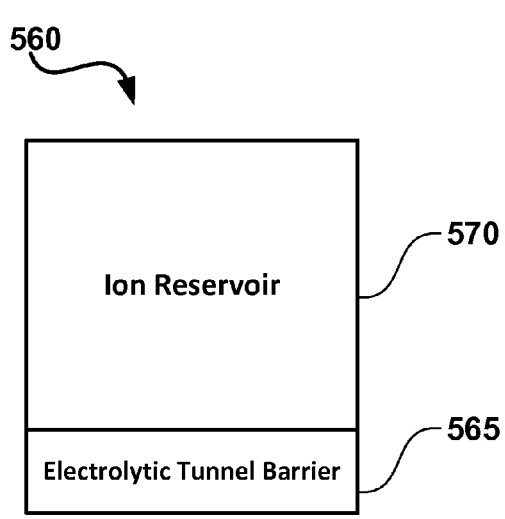
FIG. 5C depicts a block diagram representing the basic components of one embodiment of a memory element.
Figure 5D:
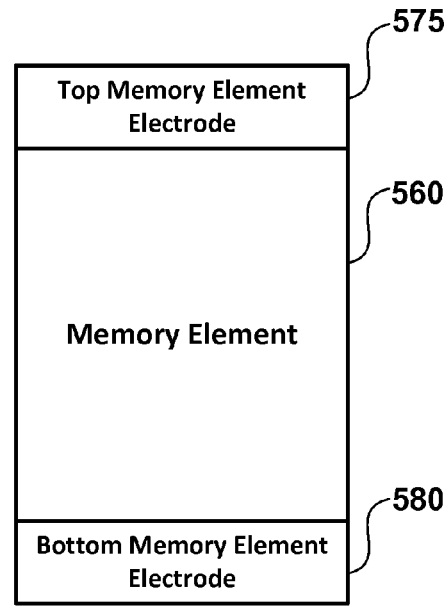
FIG. 5D depicts a block diagram of the memory element of FIG. 5C in a two-terminal memory cell.
Figure 5E:
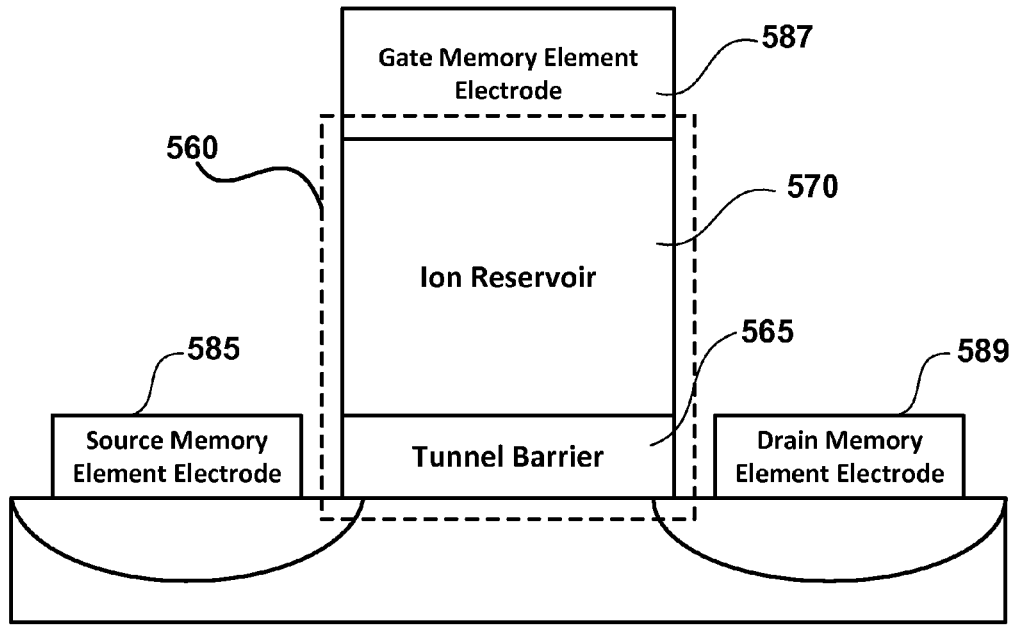
FIG. 5E depicts a block diagram of the memory element of FIG. 5C in a three-terminal memory cell.

FIG. 5B illustrates an alternative exemplary recovery operation. Here, Z (i.e., restore data 242 (FIG. 2)) equals zero and voltage signal patterns 520-528 applied to various nodes (i.e., nodes 215-218 (FIG. 2)) associated with a recovery operation are shown. In some examples, Z may be equal to zero when memory element 232 (FIG. 2) is in an erased state and memory element 230 (FIG. 2) is in a programmed state. To restore memory element 232 back to approximately its original erased state, restore circuit 212 (FIG. 2) applies a voltage of Vwrite volts to node 218 (FIG. 2) and holds node 216 (FIG. 2) at close to zero volts. To restore memory element 230 back to approximately its original programmed state, restore circuit 212 applies a voltage of Vwrite volts to node 215 (FIG. 2) and holds node 217 (FIG. 2) at close to zero volts. During a recovery operation when Z is equal to zero, nodes 215-218 are at voltage levels of Vwrite, zero, zero, and Vwrite, respectively. By applying the appropriate voltages, memory elements 230-232 may be restored to their original resistive values, correcting corruption caused by read disturbs.

In some examples, when Z equals one or when Z equals zero, Z may be used to control restore circuit 212 to apply the proper voltages to nodes 215-218. Although in these examples, Z is represented using a binary scheme (as one or zero), in other examples, other signaling schemes may be used.

Figure 6A:
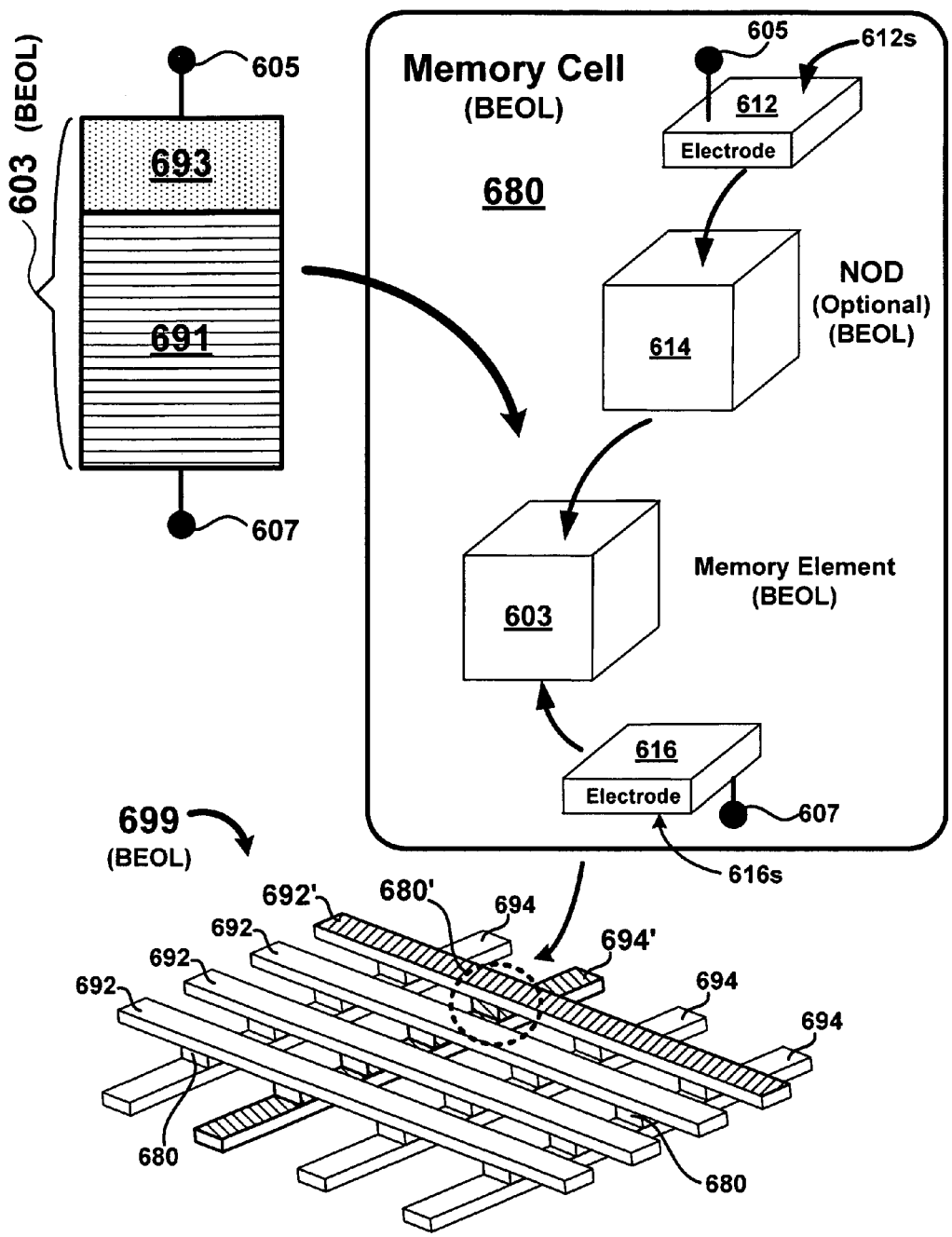
FIG. 6A depicts an example of memory cells positioned in a two-terminal cross-point array.

FIG. 6A depicts an example of arrayed memory cells according to various embodiments of the invention. In this example, a non-volatile re-writable memory cell 680 can be used to implement the aforementioned non-volatile memory elements 230-232 for fuse element 200. The memory cell 680 includes a memory element 603 and terminals 605 and 607 with the memory element 603 electrically in series with the terminals 605 and 607. The memory element 603 can include electrically in series with the terminals 605 and 607 a thin film layer of an electronically insulating material 693 (e.g., an electrolytic tunnel barrier material) in contact with one or more layers of a conductive oxide material 691 (e.g., a conductive metal oxide or a binary oxide). For example, the thin film layer of the electronically insulating material 693 can have a thickness of approximately 50 Å or less and can be made from a material including but not limited to yttria-stabilized zirconia (YSZ), zirconia ($ZrO_x$) (e.g., $ZrO_2$), hafnium oxide ($HfO_x$) (e.g., $HfO_2$), gadolinium oxide ($GdO_x$), and erbium oxide ($ErO_x$) (e.g., $Er_2O_3$), where x>0. The one or more layers of the conductive oxide material can be made from materials including but not limited to: manganites (e.g., $PrCaMnO_x$—PCMO; $LaCaMnO_x$—LCMO; $LaSrMnO_x$—LSMO; $PrMnO_x$—PMO; and $LaSrCaMnO_x$—LSCMO); titanates (e.g., strontium titanate STO and a reduced STO); zirconates (SZO:Cr, CNO:Cr, TaO:Cr); $SrRuO_x$—SRO; $LaSrCrO_x$—LSCrO; $LaNiO_x$—LNO; $LaSrCrO_x$—LSCrO; $LaSrFeO_x$—LSFeO; high Tc superconductors (e.g., YBCO); and conductive binary oxides: zinc oxide ($ZnO_x$) (e.g., $ZnO_2$); and a doped titanium oxide ($TiO_x$) (e.g., $TiO_2$). The titanium oxide ($TiO_x$) can be doped with a material including but not limited to niobium (Nb). The doping of the titanium oxide ($TiO_x$) can be accomplished by a process including but not limited to co-sputtering during deposition of the layer(s) 691. Thicknesses for the layer 691 will be application dependent. Typically, the thickness of the layer 691 is approximately 500 Å or less. The layers 691 and 693 can be deposited using processes including but not limited to physical vapor deposition (PVD), sputtering, reactive sputtering, co-sputtering, atomic layer deposition (ALD), chemical vapor deposition (CVD), molecular beam epitaxy (MBE), spin-on deposition, pulsed laser deposition, ion-beam deposition, electron-beam (e-beam) deposition, or thermal evaporation, just to name a few.

Terminals 605 and 607 can be electrically coupled with or can be formed as electrodes 612 and 616. The electrodes (612, 616) can be made from an electrically conductive material including but not limited to, platinum (Pt), gold (Au), silver (Ag), iridium (Ir), iridium oxide ($IrO_x$), ruthenium (Ru), palladium (Pd), aluminum (Al), and the like.

In at least some embodiments, memory cell 680 can include an optional non-ohmic device (NOD) 614, which, in turn, can be formed on the memory element 603 (e.g., either above or below memory element 603). NOD 614 can be a "metal-insulator-metal" (MIM) structure that includes one or more layers of electronically insulating material that are in contact with one another and sandwiched between metal layers (e.g., electrodes), or NOD 614 can be a pair of diodes connected in a back-to-back configuration. U.S. patent application Ser. No. 11/881,473, filed Jul. 26, 2007, now U.S. Published Application No. 2009-0027976 A1, and entitled "Threshold Device For A Memory Array" and U.S. patent application Ser. No. 12/283,339, filed Sep. 11, 2008, now U.S. Published Application No. 2009-0016094 A1, and entitled "Selection Device for Re-Writable Memory" are both hereby incorporated by reference in their entirety and for all purposes and describe metal-insulator-metal and diode based non-ohmic devices. NOD 614 can be another type of selection device and the present invention is not limited to the examples disclosed herein. The NOD 614 and the memory element 603 are electrically in series with each other and with the terminals 605 and 607. Memory cell 680 can be formed between conductive array lines, such as array lines 692 and 694. Thus, memory cell 680 can be formed in an array of other memory cells. A configuration of the array (e.g., number of rows and columns) can depend in part on the number of non-volatile memory elements are required for a specific application. For example, if 500 non-volatile memory elements are required, then the array would include at least 500 of the memory cells 680. Portions of the array can be used to implement the non-volatile memory elements and other portions of the array can be used for data storage purposes with each portion having a different address space in a memory map. The array can be a cross-point array 699 including a plurality of the conductive array lines 692 and 694, and a plurality of the memory cells 680. For example, array lines 692 can be electrically coupled with the electrodes 612 of the memory cells 680 and/or may be in contact with a surface 612s of the electrodes 612 and array lines 694 can be electrically coupled with the electrodes 616 of the memory cells 680 and/or may be in contact with a surface 616s of the electrodes 616. A memory cell 680' is selected for a data operation (e.g., read or write operation) by applying select voltages (e.g., read voltages, write voltages, program voltages, or erase voltages) to its respective conductive array lines 692' and 694'. In some applications, the memory cell(s) 680 can be electrically coupled to circuitry using conductive lines that are not conductive array lines. For example, a pair of conductive lines can be used to electrically couple circuitry with electrodes 612 and 616 of the memory cell 680. Further, the pair of conductive lines can be coupled with the electrodes 612 and 616 of additional memory cells 680 and/or additional conductive lines to form parallel, series, or series/parallel combinations of memory cells for fuse element 200.

Figure 7:
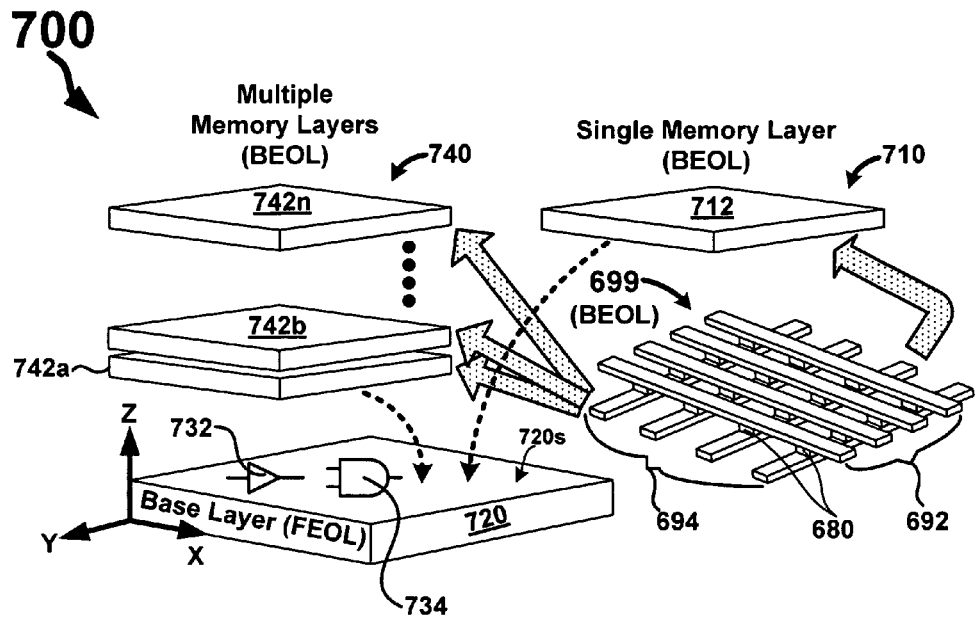
FIG. 7 depicts an integrated circuit including memory cells disposed in a single memory array layer or in multiple memory array layers and fabricated over a substrate that includes active circuitry fabricated in a logic layer.

Turning now to FIG. 7, an integrated circuit 700 can include non-volatile and re-writable memory cells 680 disposed in a single layer 710 or in multiple layers 740 of memory, according to various embodiments of the invention. The single 710 or multiple 740 layers of memory can be fabricated BEOL. In this example, integrated circuit 700 is shown to include either multiple layers 740 of memory (e.g., layers 742a, 742b, ... 742n) or a single layer 710 of memory 712 formed on (e.g., fabricated directly on top of surface a 720s) a base layer 720 (e.g., a silicon wafer). The base layer 720 can be fabricated FEOL with the single or multiple layers of memory 710 and/or 740 fabricate BEOL on top of the base layer 720. In at least some embodiments, each layer of memory (712, or 742a, 742b, ... 742n) can include the cross point array 699 fabricated (e.g., BEOL) and having conductive array lines (692, 694) arranged in different directions (e.g., substantially orthogonal to one another) to access memory cells 680 (e.g., two-terminal memory cells). For example, conductors 692 can be X-direction array lines (e.g., row conductors) and conductors 694 can be Y-direction array lines (e.g., column conductors). Base layer 720 (e.g., substrate 602 in FIG. 6A) can include a bulk semiconductor substrate upon which circuitry, such as memory access circuits (e.g., address decoders, drivers, sense amps, etc.) can be formed. For example, base layer 720 may be a silicon (Si) substrate upon which the active circuitry 732 and 734 are fabricated. The active circuitry 732 and 734 includes analog and digital circuits configured to perform data operations on the memory layer(s) that are fabricated above the base layer 720. An interconnect structure (not shown) including vias, plugs, thrus, and the like, may be used to electrically communicate signals from the active circuitry 730 to the conductive array lines (692, 694).

Figure 8A:
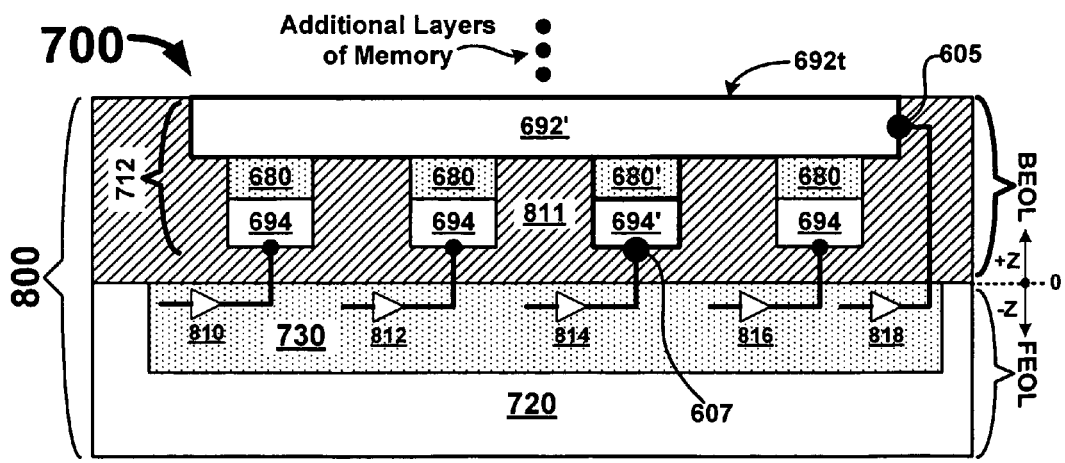
FIG. 8A depicts a cross-sectional view of an integrated circuit including a single layer of memory fabricated over a substrate including active circuitry fabricated in a logic layer.

Reference is now made to FIG. 8A, where integrated circuit 700 includes the base layer 720 and active circuitry 732 and 734 fabricated on the base layer 720. As one example, the base layer 720 can be a silicon (Si) wafer and the active circuitry 732 and 734 can be microelectronic devices formed on the base layer 720 using a CMOS fabrication process. The memory cells 680 and their respective conductive array lines (692, 694) can be fabricated on top of the active circuitry 732 and 734 in the base layer 720. Those skilled in the art will appreciate that an inter-level interconnect structure (not shown) can electrically couple the conductive array lines (692, 694) with the active circuitry 732 and 734 which may include several metal layers. For example, vias can be used to electrically couple the conductive array lines (692, 694) with the active circuitry 732 and 734. The active circuitry 732 and 734 may include but is not limited to the circuitry portions depicted in FIG. 2 for performing margin restore on the fuse element 200, address decoders, sense amps, memory controllers, data buffers, direct memory access (DMA) circuits, voltage sources for generating the read and write voltages, just to name a few. For example, active circuits 810-818 can be configured to apply the select voltage potentials (e.g., read and write voltage potentials) to selected conductive array lines (692', 694') for selected memory cell 680' via terminals 605 and 607 that are electrically coupled with outputs of active circuits 814 and 818 respectively. Moreover, active circuits 810-818 may be coupled with the conductive array lines (692', 694') to sense the read current $I_R$ from selected memory cells 680' during a read operation and the sensed current can be processed by active circuits 810-818 to determine the conductivity profiles (e.g., the resistive state) of the selected memory cells 680'. In some applications, it may be desirable to prevent un-selected array lines (692, 694) from floating. The active circuits 810-818 can be configured to apply an un-select voltage potential (e.g., approximately a ground potential) to the un-selected array lines (692, 694). A dielectric material 811 (e.g., $SiO_2$) may be used where necessary to provide electrical insulation between elements of the integrated circuit 700. Collectively, the FEOL base layer 720 and the one or more layers of BEOL memory 712 can be referred to as a die 800 as will be described in greater detail below in regards to FIG. 11.

Although only a single layer of memory 712 is depicted in FIG. 8A, additional layers of memory (e.g., 742a-742n) can be vertically fabricated BEOL above an upper surface 692t of conductive array line 692 to form a multi-layer cross-point memory array. The vertically stacked layers of memory can have electrically isolated conductive array lines as depicted in FIGS. 6-8A or can have shared conductive array lines as depicted in FIGS. 5, 9, and 10.

Figure 8B:
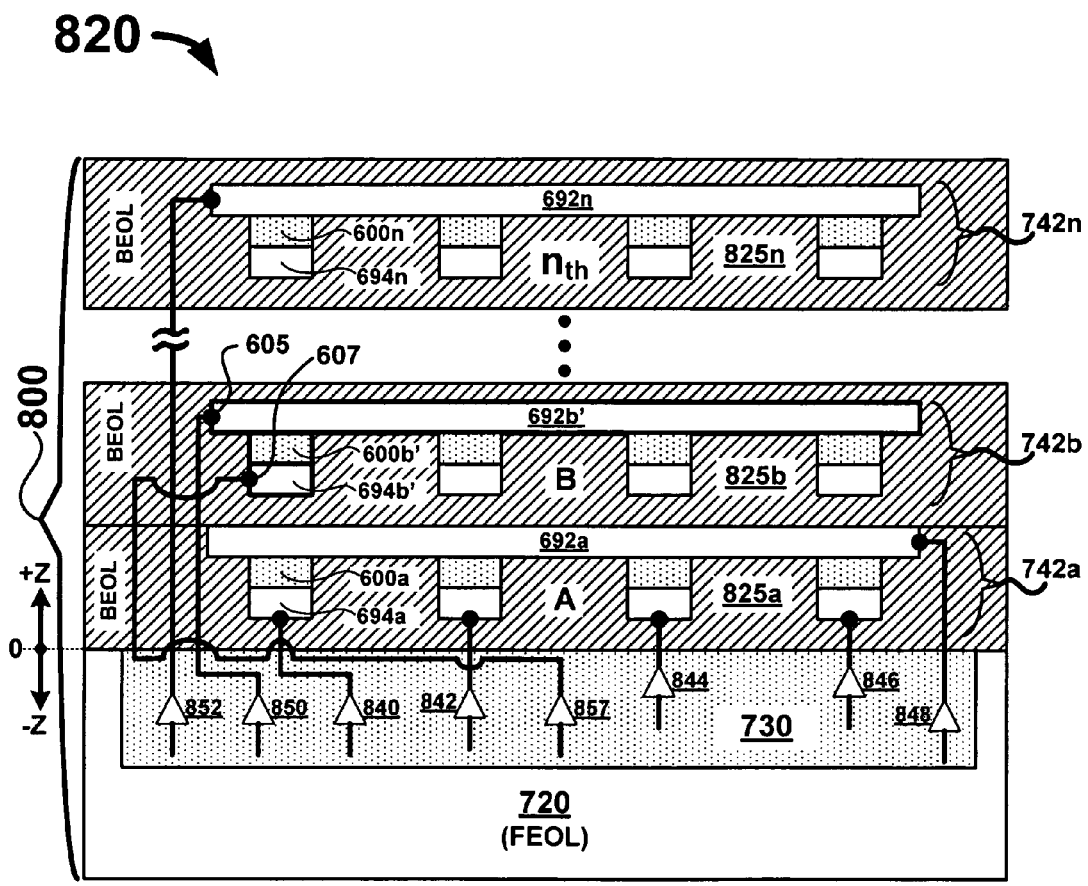
FIG. 8B depicts a cross-sectional view of an integrated circuit including vertically stacked layers of memory fabricated over a substrate including active circuitry fabricated in a logic layer.

Turning now to FIG. 8B, an integrated circuit 820 includes a plurality of non-volatile memory arrays 742a, 742b, ... 742n that are vertically stacked above one another (e.g., along the +Z axis) and are positioned above the base layer 720 that includes the active circuitry 730. Collectively, the FEOL base layer 720 and the plurality of non-volatile BEOL memory arrays 742a, 742b, ... 742n can be referred to as a die 800. The integrated circuit 820 includes vertically stacked memory layers A and B and may include additional memory layers up to an nth memory layer. The memory layers A, B, ... through the nth layer can be electrically coupled with the active circuitry 730 in the base layer 720 by an inter-level interconnect structure as was described above. Layer A includes memory cells 600*a* and first and second conductive array lines (692*a*, 694*a*), Layer B includes memory cells 600*b* and first and second conductive array lines (692*b*, 694*b*), and if the nth layer is implemented, then the nth layer includes memory cells 600*n* and first and second conductive array lines (692*n*, 694*n*). Dielectric materials 825*a*, 825*b*, and 825*n* (e.g., $SiO_2$) may be used where necessary to provide electrical insulation between the memory layers and memory elements of the integrated circuit 820. Active circuits 840-857 can be configured to apply the select voltage potentials (e.g., read and write voltage potentials) to selected conductive array lines (e.g., 692*a, b, . . . n*, and 694*a, b, . . . n*). Driver circuits 850 and 857 are activated to select conductive array lines 692' and 694' to select memory cell 600*b'* for a data operation. As was described above, the active circuits 730 can be used to sense the read current $I_R$ from selected memory cells 600*b'* during a read operation and can be configured to apply the un-select voltage potential to the un-selected array lines.

Figure 9:
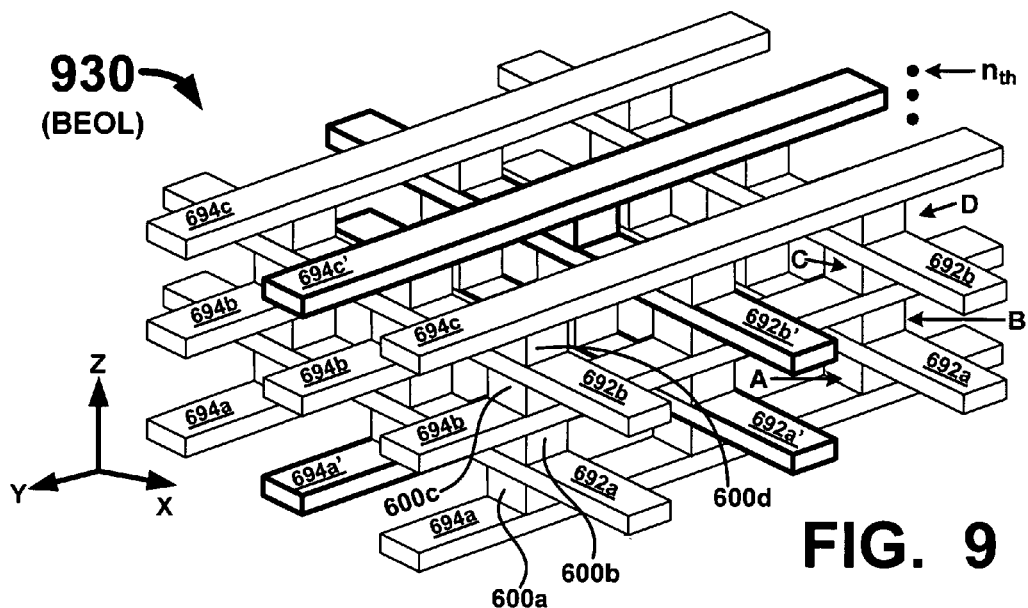
FIG. 9 depicts a vertically stacked layers of memory in which conductive array lines are shared by memory cells in adjacent layers.

Attention is now directed to FIG. 9, where a vertically stacked array 930 includes a plurality of memory layers A, B, C, and D with each memory layer including memory cells 600*a*, 600*b*, 600*c*, and 600*d*. Although only four layers are depicted, the array 930 can include additional layers up to an nth layer. The array 930 includes two levels of x-direction conductive array lines 692*a* and 692*b*, and three levels of y-direction conductive array lines 694*a*, 694*b*, and 694*c*. In contrast to the integrated circuit 820 depicted in FIG. 8B where each array layer is electrically isolated from other layers by a dielectric material (825*a*, 825*b*, . . . 825*n*), each memory cell 600*a*, 600*b*, 600*c*, and 600*d* shares a conductive array line with other memory cells that are positioned above, below, or both above and below that memory cell. Conductive array lines 692*a'* and 694*a'* select a memory cell 600*a'* for a data operation, and conductive array lines 692*b'* and 694*c'* select a memory cell 600*d'* for a data operation (see FIG. 10).

Figure 10:
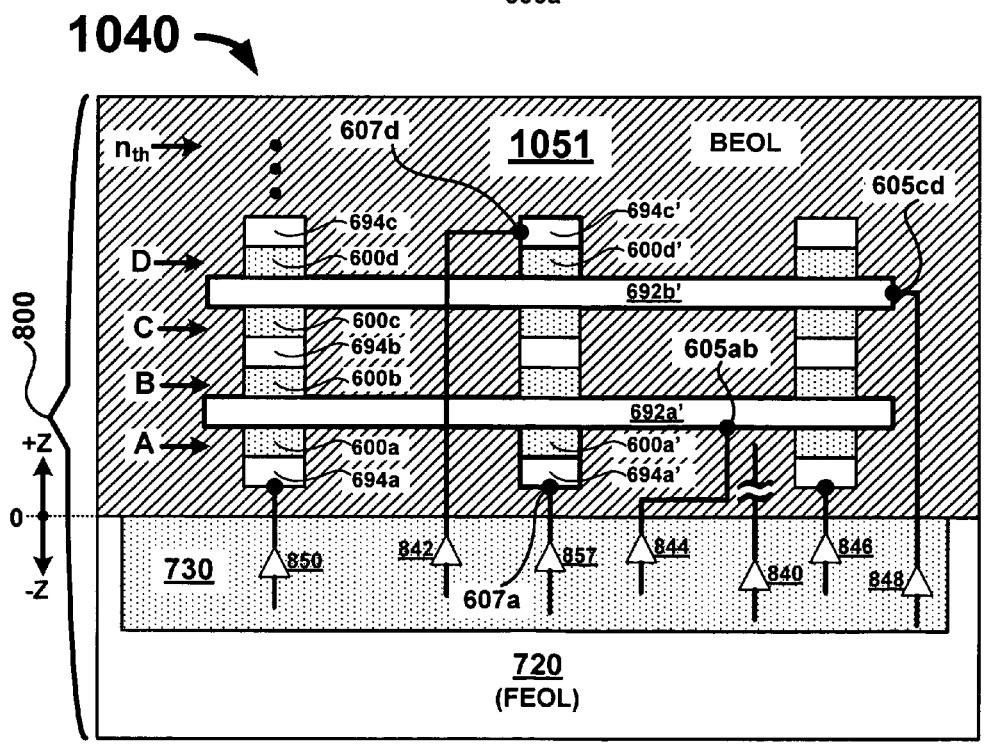
FIG. 10 depicts an integrated circuit including vertically stacked layers of memory with shared conductive array lines fabricated over a substrate including active circuitry fabricated in a logic layer.

In FIG. 10, an integrated circuit 1040 includes base layer 720, active circuitry 730, and vertically staked memory layers A, B, C, and D that are fabricated above the base layer 720. Collectively, the FEOL base layer 720 and the plurality of non-volatile BEOL memory layers A, B, C, and D can be referred to as a die 800. Active circuits 840-857 are configured to perform data operations on the vertically stacked memory layers A, B, C, and D. Driver circuits 844 and 857 are activated to select memory cell 600*a'* for a data operation and driver circuits 842 and 848 are activated to select memory cell 600*d'* for a data operation. A dielectric layer 1051 is operative to electrically isolate the various components of integrated circuit 1040.

Figure 11:
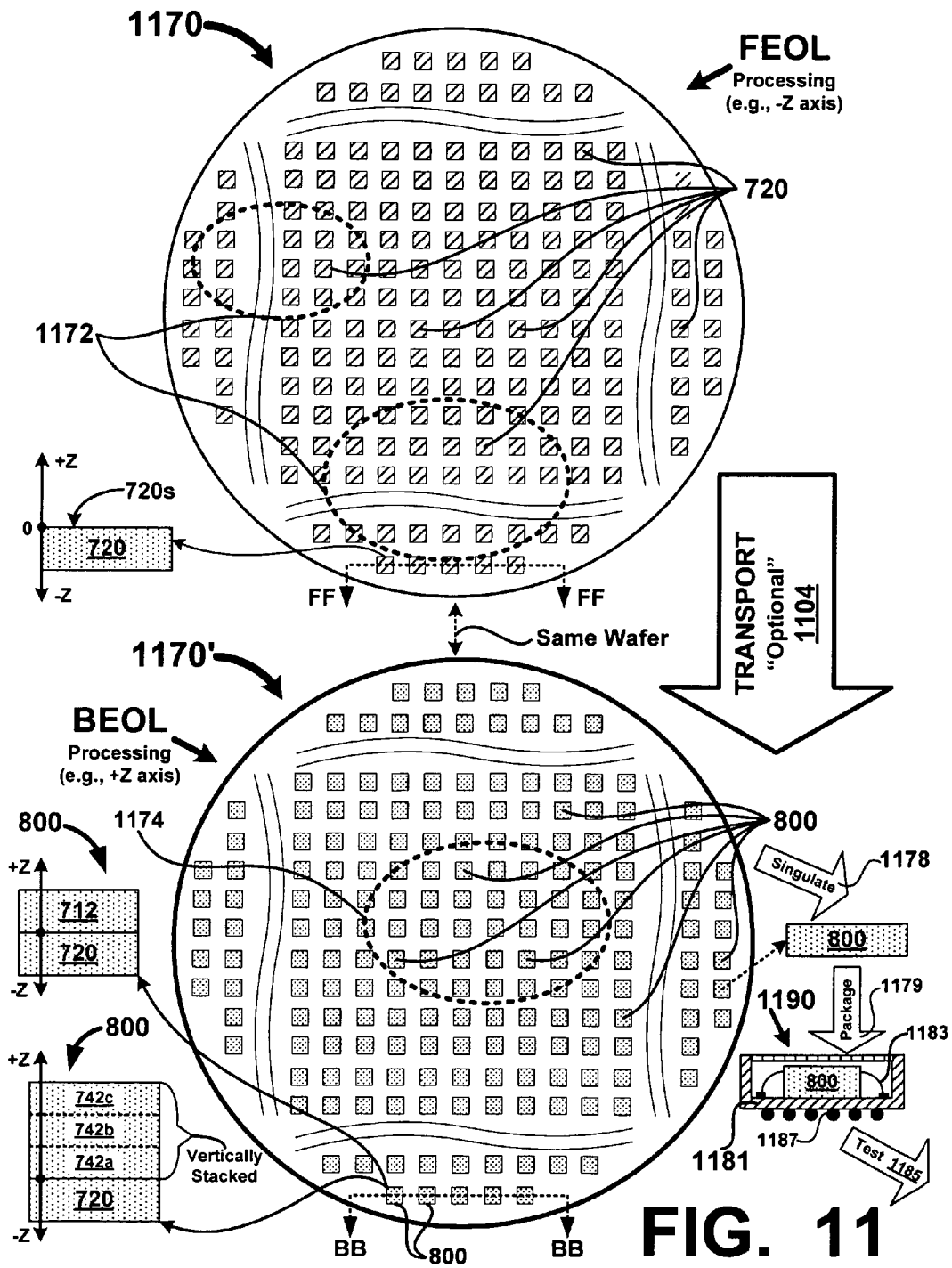
FIG. 11 depicts top plan views of a wafer processed FEOL to form a plurality of base layer die including active circuitry and the same wafer subsequently processed BEOL to form one or more layers of memory directly on top of the base layer die where the finished die can subsequently be singulated, tested, and packaged into integrated circuits.

Reference is now made to FIG. 11, where a top plan view depicts a single wafer (denoted as 1170 and 1170') at two different stages of fabrication: FEOL processing on the wafer denoted as 1170 during the FEOL stage of processing where active circuitry 730 is formed; followed by BEOL processing on the same wafer denoted as 1170' during the BEOL stage of processing where one or more layers of non-volatile memory are formed. Wafer 1170 includes a plurality of the base layer die 720 (see 720 in FIG. 7) formed individually on wafer 1170 as part of the FEOL process. As part of the FEOL processing, the base layer die 720 may be tested 1172 to determine their electrical characteristics, functionality, performance grading, etc. After all FEOL processes have been completed, the wafer 1170 is optionally transported 1104 for subsequent BEOL processing (e.g., adding one or more layers of memory such as single layer 712 or multiple layers 742*a*, 742*b*, . . . 742*n*) directly on top of each base layer die 720. A base layer die 720 is depicted in cross-sectional view along a dashed line FF-FF where the substrate the die 720 is fabricated on (e.g., a silicon Si wafer) and its associated active circuitry 730 are positioned along the −Z axis. For example, the one or more layers of memory are grown directly on top of an upper surface 720*s* of each base layer die 720 as part of the subsequent BEOL processing.

During BEOL processing the wafer 1170 is denoted as wafer 1170', which is the same wafer subjected to additional processing to fabricate the memory layer(s) directly on top of the base layer die 720. Base layer die 720 that failed testing may be identified either visually (e.g., by marking) or electronically (e.g., in a file, database, email, etc.) and communicated to the BEOL fabricator and/or fabrication facility. Similarly, performance graded base layer die 720 (e.g., graded as to frequency of operation) may identified and communicated to BEOL the fabricator and/or fabrication facility. In some applications the FEOL and BEOL processing can be done by the same fabricator or performed at the same fabrication facility. Accordingly, the transport 1104 may not be necessary and the wafer 1170 can continue to be processed as the wafer 1170'. The BEOL process forms the aforementioned memory layer(s) directly on top of the base layer die 720 to form a finished die 800 (see die 800 in FIGS. 8A, 8B, and 10) that includes the FEOL circuitry portion 720 along the −Z axis and the BEOL memory portion along the +Z axis (see FIGS. 8A-10). A cross-sectional view along a dashed line BB-BB depicts a memory device die 800 with a single layer of memory 712 grown (e.g., fabricated) directly on top of base die 720 along the +Z axis, and alternatively, another memory device die 800 with three vertically stacked layers of memory 742*a*, 742*b*, and 742*c* grown (e.g., fabricated) directly on top of base die 720 along the +Z. Finished die 800 on wafer 1170' may be tested 1174 and good and/or bad die identified. Subsequently, the wafer 1170' can be singulated 1178 to remove die 800 (e.g., die 800 are precision cut or sawed from wafer 1170') to form individual memory device die 800. The singulated die 800 may subsequently be packaged 1179 to form integrated circuits 1190 for mounting to a PC board or the like, as a component in an electrical system (not shown). Here a package 1181 can include an interconnect structure 1187 (e.g., pins, solder balls, or solder bumps) and the die 800 mounted in the package 1181 and electrically coupled 1183 with the interconnect structure 1187 (e.g., using wire bonding). The integrated circuits 1190 (IC 1190 hereinafter) may undergo additional testing 1185 to ensure functionality and yield.

One or more of the IC's 1190 can be used in systems including but not limited to data storage systems, a system that requires dual-port memory, a system requiring non-volatile memory, a system requiring emulation of one or more memory types as described above. Unlike conventional FLASH non-volatile memory, the IC's 1190 do not require an erase operation prior to a write operation so the latency associated with the erase operation is eliminated and the latency associated with FLASH OS and/or FLASH file system required for managing the erase operation and/or other FLASH operations are eliminated.

The foregoing examples have been described in some detail for purposes of clarity of understanding, but are not limited to the details provided. There are many alternative ways and techniques for implementation. The disclosed examples are illustrative and not intended to be restrictive to the examples and details provided.

What is claimed is:

1. A margin restore fuse element, comprising:
a semiconductor substrate including active circuitry fabricated front-end-of-the-line (FEOL) on the semiconductor substrate, the active circuitry including
a latch operative as an amplifier and configured to store temporary data in response to an enable signal, and
a restore circuit electrically coupled with the latch;
an interlayer interconnect structure fabricated FEOL above and in contact with the semiconductor substrate and positioned vertically above the active circuitry: and
a memory layer vertically fabricated back-end-of-the-line (BEOL) directly above the semiconductor substrate and in contact with the interlayer interconnect structure, the memory layer including a plurality of re-writeable non-volatile BEOL memory elements having exactly two terminals, each BEOL memory element including an ion reservoir and a tunnel barrier electrically in series with each other and with its two terminals, the ion barrier including mobile oxygen ions, the BEOL memory elements retain stored data in an absence of electrical power, the BEOL memory elements including
a first BEOL memory element configured to store a first resistive value and electrically coupled with the latch and the restore circuit through the interlayer interconnect structure, and
a second BEOL memory element configured to store a second resistive value that is different than the first resistive value and electrically coupled with the latch and the restore circuit through the interlayer interconnect structure,
wherein the restore circuit is configured to perform a restore data operation to substantially restore the first and second BEOL memory elements to the first and second resistive values, respectively, and the latch is operative to generate restore data used by the restore circuit to perform a restore data operation.

2. The margin restore fuse element of claim 1, wherein the latch is configured to generate the restore data based on the temporary data.

3. The margin restore fuse element of claim 2, wherein the restore data operation comprises applying a voltage differential to the two terminals of the first and second BEOL memory elements based on the restore data.

4. The margin restore fuse element of claim 1, wherein at least a portion of the plurality of re-writeable non-volatile BEOL memory elements are positioned in a two-terminal cross-point array that includes a plurality of conductive array lines with each memory element positioned between a unique pair of the plurality of conductive array lines, the two terminals of each memory element are directly electrically in series with its unique pair, and the two-terminal cross-point array is disposed in the memory layer.

5. The margin restore fuse element of claim 1, wherein the ion reservoir comprises a layer of conductive metal oxide (CMO).

6. The margin restore fuse element of claim 1, wherein the first BEOL memory element is electrically coupled with another BEOL memory element to form a first multi-element unit.

7. The margin restore fuse element of claim 6, wherein the first BEOL memory element and the another BEOL memory element are electrically coupled in parallel, in series, or in a series/parallel combination.

8. The margin restore fuse element of claim 6, wherein the first BEOL memory element and the another BEOL memory element are positioned in a two-terminal cross-point array that is disposed in the memory layer.

9. The margin restore fuse element of claim 1, wherein the second memory element is electrically coupled with another BEOL memory element to form a second multi-element unit.

10. The margin restore fuse element of claim 9, wherein the second BEOL memory element and the another BEOL memory element in the second multi-element unit are electrically coupled in parallel, in series, or in a series/parallel combination.

11. The margin restore fuse element of claim 9, wherein the second memory element and the another BEOL memory element are positioned in a two-terminal cross-point array that is disposed in the memory layer.

* * * * *